United States Patent
Chen et al.

(10) Patent No.: US 10,292,496 B2
(45) Date of Patent: May 21, 2019

(54) BRACKET DEVICE

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/435,305

(22) Filed: Feb. 17, 2017

(65) Prior Publication Data

US 2018/0070724 A1 Mar. 15, 2018

(30) Foreign Application Priority Data

Sep. 13, 2016 (TW) .............................. 105129906 A (51) Int. Cl.
| | |
|---|---|
| A47B 96/06 | (2006.01) |
| A47B 57/34 | (2006.01) |
| A47B 57/54 | (2006.01) |
| A47B 96/07 | (2006.01) |
| F16B 2/10 | (2006.01) |
| A47B 57/48 | (2006.01) |
| H05K 7/14 | (2006.01) |

(Continued)

(52) U.S. Cl.
CPC .............. *A47B 96/06* (2013.01); *A47B 57/34* (2013.01); *A47B 57/487* (2013.01); *A47B 57/545* (2013.01); *A47B 88/43* (2017.01); *A47B 96/07* (2013.01); *F16B 2/10* (2013.01); *H05K 7/1489* (2013.01); *A47B 57/408* (2013.01)

(58) Field of Classification Search
CPC ....... A47B 57/406; A47B 57/38; A47B 96/07; A47B 96/06; A47B 57/34; A47B 57/545; F16B 2/10
USPC ..... 248/218.4, 219.1, 219.3, 221.11, 222.14, 248/244; 211/192, 26, 162, 175, 782; 312/334.4, 334.46
See application file for complete search history.

(56) References Cited

U.S. PATENT DOCUMENTS

| | | | |
|---|---|---|---|
| 7,357,362 B2 | 4/2008 | Yang | |
| 7,552,899 B2* | 6/2009 | Chen | A47B 88/43 211/26 |
| 7,699,279 B2* | 4/2010 | Chen | A47B 88/43 248/220.22 |

(Continued)

*Primary Examiner* — Muhammad Ijaz
(74) *Attorney, Agent, or Firm* — Winston Hsu (57) ABSTRACT

A bracket device includes a longitudinal wall, an end wall, a mounting member, a protruded lug, a blocking member and an elastic member. The end wall is connected to the longitudinal wall. The mounting member is connected to the end wall. The protruded lug is arranged on the longitudinal wall and includes a supporting section. The blocking member is movably mounted to the protruded lug, and includes a blocking part and an extension part. The extension part is configured to abut against the supporting section of the protruded lug. The elastic member is configured to provide an elastic force to the blocking member for holding the blocking part of the blocking member at a predetermined position relative to the end wall.

12 Claims, 6 Drawing Sheets

(51) Int. Cl.
*A47B 88/43* (2017.01)
*A47B 57/40* (2006.01)

(56) References Cited

U.S. PATENT DOCUMENTS

| | | | | |
|---|---|---|---|---|
| 7,703,734 B2* | 4/2010 | Chen | ............... | A47B 88/43 108/108 |
| 7,798,581 B2* | 9/2010 | Chen | ............... | H05K 7/1489 211/26 |
| 7,878,468 B2* | 2/2011 | Chen | ............... | A47B 88/43 211/26 |
| 8,353,494 B2* | 1/2013 | Peng | ............... | A47B 88/43 211/192 |
| 8,371,454 B2* | 2/2013 | Chen | ............... | H05K 7/1421 211/26 |
| 8,403,434 B2* | 3/2013 | Yu | ............... | H05K 7/1489 248/244 |
| 8,596,471 B2* | 12/2013 | Chen | | |
| 8,807,351 B2* | 8/2014 | Lin | ............... | A47B 88/43 211/26 |
| 2004/0108427 A1* | 6/2004 | Chen | ............... | A47B 57/40 248/244 |
| 2009/0294393 A1* | 12/2009 | Chen | ............... | H05K 7/1489 211/175 |
| 2011/0233355 A1* | 9/2011 | Peng | ............... | H05K 7/1489 248/218.4 |
| 2012/0292274 A1* | 11/2012 | Lin | ............... | A47B 88/43 211/86.01 |
| 2013/0056432 A1* | 3/2013 | Lin | ............... | H05K 7/1489 211/123 |
| 2014/0186106 A1* | 7/2014 | Gu | ............... | A47B 88/43 403/327 |
| 2015/0069196 A1* | 3/2015 | Chen | ............... | A47B 47/0058 248/218.4 |
| 2015/0181753 A1* | 6/2015 | Murakami | ............... | H05K 7/1489 211/26 |

* cited by examiner

BRACKET DEVICE

BACKGROUND OF THE INVENTION

1. Field of the Invention

The present invention relates to a bracket device, and more particularly, to a bracket device applicable to a slide rail assembly.

2. Description of the Prior Art

Generally, in a rack system, a carried object can be mounted to a rack through a pair of slide rail assemblies. Wherein, a first rail of the slide rail assembly is usually mounted to the rack through a bracket device, and a second rail of the slide rail assembly is movable relative to the first rail and configured to carry the carried object.

US patent publication number US 2015/0069196 A1 discloses a mounting bracket (34) for a slide assembly. The mounting bracket (34) comprises a side wall (42), an end wall (44), a stop (46), and a resilient member (48). Wherein, the side wall (42) has two lugs (61) and two supports (63) located between the two lugs (61). On the other hand, the stop (46) comprises a first portion (70), a second portion (72) and a middle portion (74) connected to the first portion (70) and the second portion (72). A pivotal member (47) passes through the first portion (70), the second portion (72), the two lugs (61), and arc concaves (67) of the two supports (63), so as to pivotally connect the stop (46) to the side wall (42). Wherein, the resilient member (48) is configured to provide a force to the stop (46) to hold a first end portion (84) of the stop (46) at a position corresponding to the end wall (44). In addition, each of the first portion (70) and the second portion (72) of the stop (46) has an extension section (82). The extension section (82) is configured to abut against the side wall (42) in response to the force of the resilient member (48) so as to hold the stop (46) at a predetermined position. Moreover, a bent portion (88) of the resilient member (48) is configured to abut against a contact member (58) of the side wall (42).

However, due to structural configuration and/or space limitation, the mounting bracket is preferred to have fewer and simpler structural features. Therefore, it is important to develop different mounting brackets to satisfy specific requirements of the market.

SUMMARY OF THE INVENTION

The present invention provides a bracket device applicable to a slide rail assembly.

According to an embodiment of the present invention, a bracket device comprises a longitudinal wall, an end wall, at least one mounting member, a protruded lug, a blocking member and an elastic member. The end wall is bent relative to the longitudinal wall. The protruded lug is connected to the longitudinal wall. The protruded lug comprises a supporting section having a first side and a second side. The blocking member is pivoted to the protruded lug. The blocking member comprises a blocking part and an extension part. The extension part is configured to abut against the first side of the supporting section of the protruded lug. The elastic member is arranged between the blocking member and the second side of the supporting section of the protruded lug for providing an elastic force to the blocking member, in order to hold the blocking member at a predetermined position to face toward the end wall.

Preferably, the longitudinal wall has an opening located at a position corresponding to the blocking member.

Preferably, the protruded lug is transversely connected to the longitudinal wall.

Preferably, the supporting section is substantially longitudinally extended from the protruded lug.

Preferably, the first side of the supporting section is opposite to the second side of the supporting section.

Preferably, the elastic member comprises a first part, a second part and a winding part located between the first part and the second part. The first part abuts against the blocking member, and the second part abuts against the second side of the supporting section of the protruded lug.

Preferably, the bracket device further comprises an operating member connected to the blocking member, and configured to be operated to move the blocking member away from the predetermined position.

According to another embodiment of the present invention, a bracket device comprises a longitudinal wall, an end wall, at least one mounting member, a protruded lug, a blocking member and an elastic member. The end wall is connected to the longitudinal wall. The least one mounting member is connected to the end wall. The protruded lug is arranged on the longitudinal wall. The protruded lug comprises a supporting section. The blocking member is movably mounted to the protruded lug. The blocking member comprises a blocking part and an extension part. The extension part is configured to abut against the supporting section of the protruded lug. The elastic member is configured to provide an elastic force to the blocking member for holding the blocking part of the blocking member at a predetermined position relative to the end wall.

According to another embodiment of the present invention, a bracket device is applicable to a slide rail assembly. The slide rail assembly comprises a first rail and a second rail movable relative to the first rail. The bracket device comprises a longitudinal wall, an end wall, at least one mounting member, a protruded lug, a blocking member and an elastic member. The longitudinal wall is connected to the first rail. The end wall is bent relative to the longitudinal wall. The at least one mounting member is connected to the end wall. The protruded lug is arranged on the longitudinal wall. The protruded lug comprises a supporting section having a first side and a second side. The blocking member is movably mounted to the protruded lug. The blocking member comprises a blocking part and an extension part. The extension part is configured to abut against the first side of the supporting section of the protruded lug. The elastic member is arranged between the blocking member and the second side of the supporting section of the protruded lug for holding the blocking member at a predetermined position to face toward the end wall.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
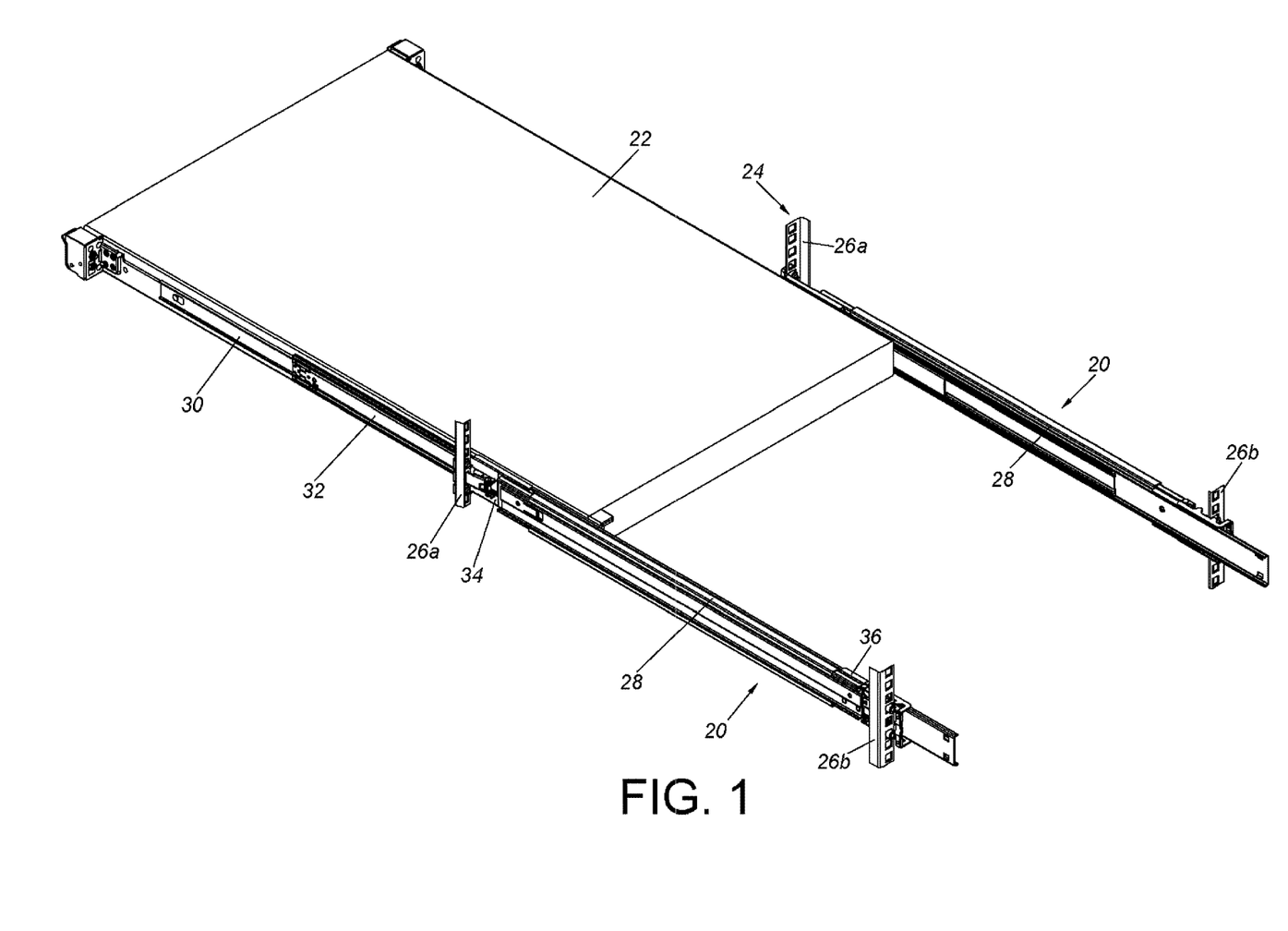
FIG. 1 is a diagram showing a rack system according to an embodiment of the present invention.

FIG. 1 is a diagram showing a rack system comprising a pair of slide rail assemblies 20 configured to mount a carried object 22 to a rack 24. In the present embodiment, the carried object 22 can be an electronic apparatus. The rack 24 comprises a pair of first posts 26a and a pair of second posts 26b. Each of the slide rail assemblies 20 comprises a first rail 28 and a second rail 30, and preferably further comprises a third rail 32 movably mounted between the first rail 28 and the second rail 30. The third rail 32 is configured to extend a traveling distance of the second rail 30 relative to the first rail 28. Furthermore, two parts of the first rail 28 can be respectively mounted to the first post 26a and the second post 26b of the rack 24 through a first bracket device 34 and a second bracket device 36. On the other hand, the second rail 30 is configured to carry the carried object 22, such that the carried object 22 can be moved out of the rack 24 through moving the second rail 30 relative to the first rail 28.

Figure 2:
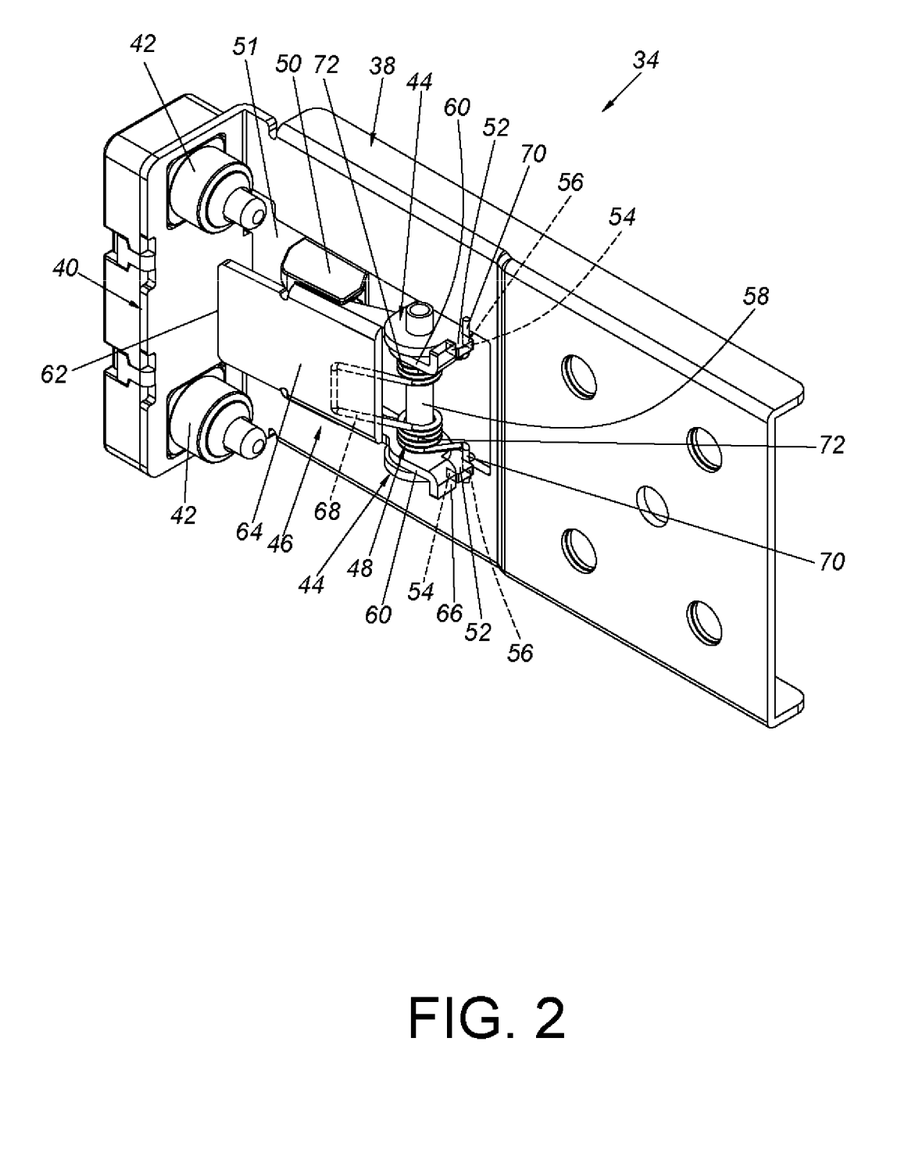
FIG. 2 is a diagram showing a bracket device according to an embodiment of the present invention.
Figure 3:
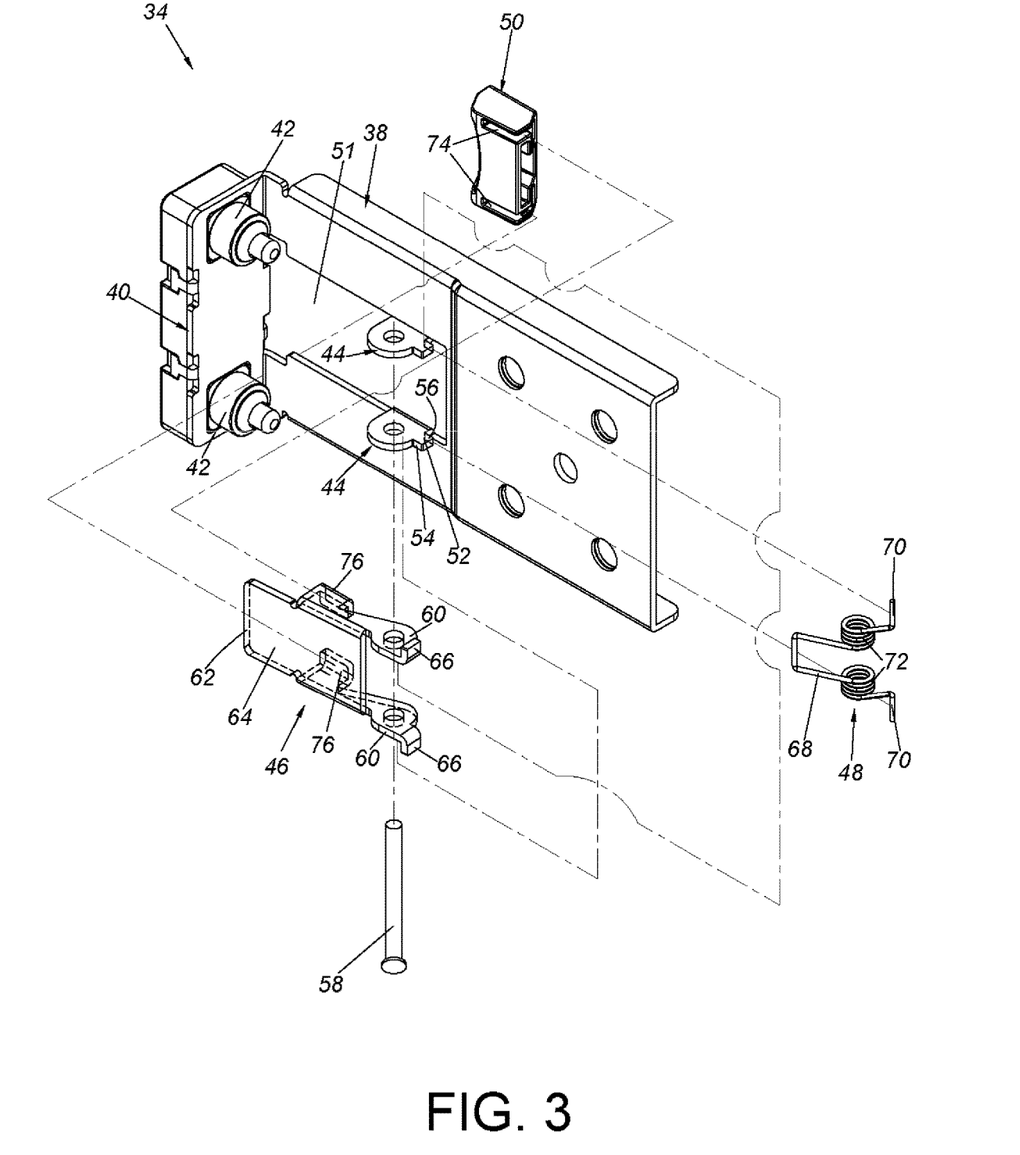
FIG. 3 is an exploded view of the bracket device according to an embodiment of the present invention.

As shown in FIG. 2 and FIG. 3, the first bracket device 34 (hereinafter referred to as bracket device 34) comprises a longitudinal wall 38, an end wall 40, at least one mounting member 42, at least one protruded lug 44, a blocking member 46 and an elastic member 48. Preferably, the bracket device 34 further comprises an operating member 50.

The end wall 40 is connected to the longitudinal wall 38 and bent relative to the longitudinal wall 38. In the present embodiment, the end wall 40 is substantially perpendicularly connected to the longitudinal wall 38. Preferably, the longitudinal wall 38 has an opening 51 located at a position corresponding to the blocking member 46.

In the present embodiment, the bracket device 34 comprises two mounting members 42 and two protruded lugs 44. Each of the mounting members 42 passes through the end wall 40. Each of the protruded lugs 44 is arranged on the longitudinal wall 38. In particular, each of the protruded lugs 44 is connected to the longitudinal wall 38. The protruded lugs 44 comprises a supporting section 52 having a first side 54 and a second side 56. In the present embodiment, the first side 54 is opposite to the second side 56. Preferably, the protruded lugs 44 is transversely connected to the longitudinal wall 38. On the other hand, the supporting section 52 is substantially longitudinally extended from the protruded lug 44.

The blocking member 46 is movably mounted to the protruded lug 44. For example, the blocking member 46 is pivoted to the protruded lug 44 through a shaft 58. In particular, the blocking member 46 comprises at least one extension part 60 and a blocking part 62. Preferably, the blocking member 46 further comprises a middle part 64 located between the at least one extension part 60 and the blocking part 62. In the present embodiment, the blocking member 46 comprises two extension parts 60. The two extension parts 60 are located between the two protruded lugs 44. Preferably, the shaft 58 is configured to penetrate through the two extension parts 60 and the two protruded lugs 44. Each of the extension parts 60 is configured to abut against the first side 54 of the supporting section 52 of the corresponding protruded lug 44. Preferably, each of the extension parts 60 comprises a bending section 66 abutting against the first side 54 of the supporting section 52 of the corresponding protruded lug 44.

The elastic member 48 is configured to provide an elastic force to the blocking member 46. In the present embodiment, the elastic member 48 is arranged between the blocking member 46 and the second side 56 of the supporting section 52 of the protruded lug 44. The blocking member 46 can be held at a predetermined position in response to the elastic force of the elastic member 48. Specifically, the elastic member 48 comprises a first part 68, a second part 70 and a winding part 72 located between the first part 68 and the second part 70. Wherein, the first part 68 abuts against the blocking member 46, and the second part 70 abuts against the second side 56 of the supporting section 52 of the protruded lug 44.

The operating member 50 is connected to the blocking member 46, and configured to be operated by a user to move the blocking member 46 away from the predetermined position. Preferably, the operating member 50 and the blocking member 46 are connected to each other through mutually-engaged structures. For example, the operating member 50 can comprise at least one recessed structure 74, and the blocking member 46 can comprise at least one protruded structure 76 for being engaged with the recessed structure 74 (as shown in FIG. 3). Or, the operating member 50 can be connected to the blocking member 46 by riveting or screwing. But the present invention is not limited thereto.

Especially, since the protruded lug 44 of the bracket device 34 comprises the supporting section 52 configured to abut against or support the blocking member 46 and the elastic member 48, the elastic member 48 of the bracket device 34 of the present invention can still provide the elastic force to the blocking member 46 in a limited space between the longitudinal wall 38 and the blocking member 46 without arranging the contact member of the prior art.

Figure 4:
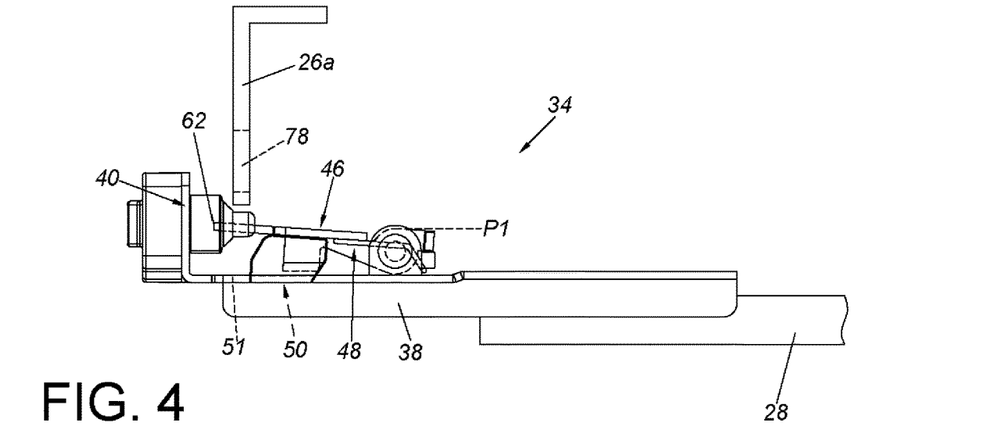
FIG. 4 is a diagram showing a rail of a slide rail assembly to be mounted to a post through the bracket device according to an embodiment of the present invention.

As shown in FIG. 4, one post of the rack 24, such as the first post 26a, comprises at least one hole 78. On the other hand, the first rail 28 is connected to the longitudinal wall 38 of the bracket device 34. In addition, the blocking member 46 can be held at a predetermined position P1 relative to the end wall 40 in response to the elastic force of the elastic member 48. Preferably, when the blocking member 46 is located at the predetermined position P1, the blocking part 62 of the blocking member 46 faces toward the end wall 40.

Figure 5:
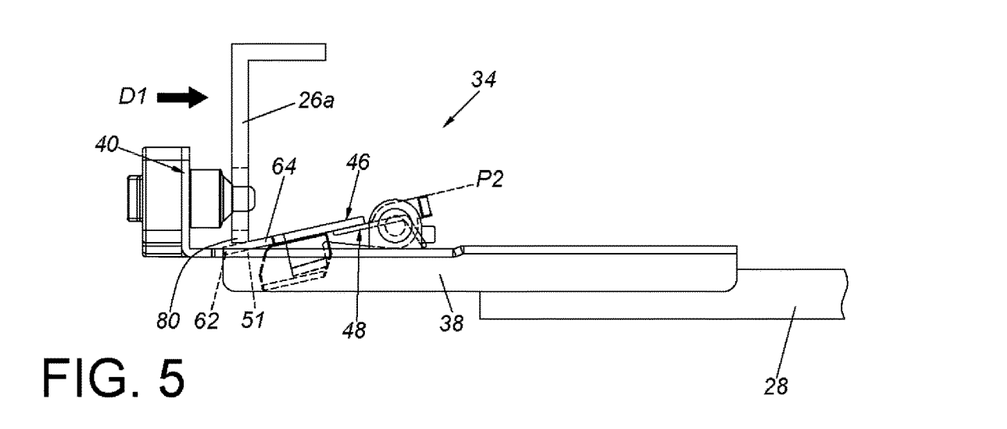
FIG. 5 is a diagram showing a mounting member of the bracket device of FIG. 4 being mounted toward the post.

As shown in FIG. 5, when the bracket device 34 is going to be mounted to the first post 26a, an edge 80 of the first post 26a can be used to press the middle part 64 of the blocking member 46, or the user can operate the blocking member 46 or the operating member 50, in order to deflect and move the blocking member 46 relative to the longitudinal wall 38 from the predetermined position P1 to another position P2, such that the blocking part 62 of the blocking member 46 is moved to be closer to the longitudinal wall 38

(or closer to the opening 51) without facing toward the end wall 40. In such state, the elastic member 48 accumulates the elastic force.

Figure 6:
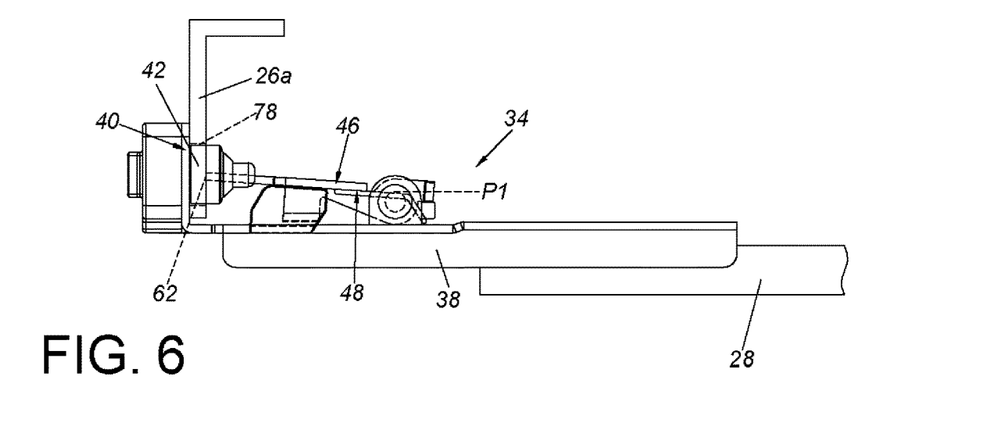
FIG. 6 is a diagram showing the mounting member of the bracket device of FIG. 5 being mounted to the post with a blocking member locking the post.
Figure 7:
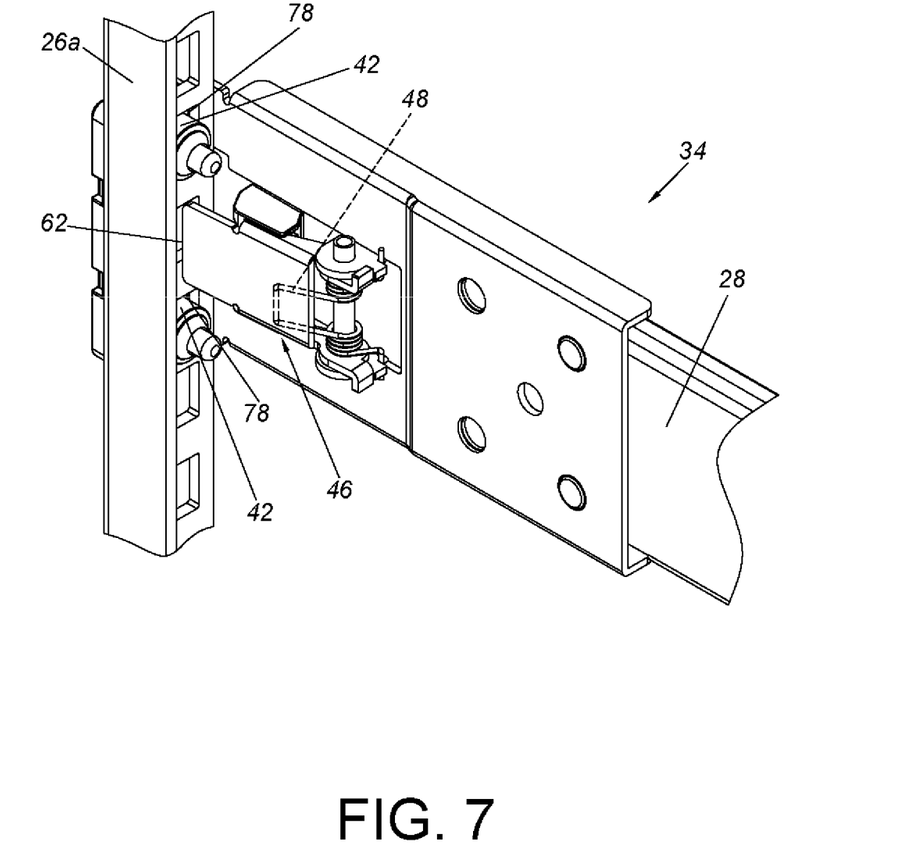
FIG. 7 is a diagram showing the bracket device being mounted to the post of the rack according to an embodiment of the present invention.

As shown in FIG. 5 and FIG. 6, when the blocking part 62 of the blocking member 46 no longer faces toward the end wall 40, the user can further move the first rail 28 along a first direction D1, in order to mount the mounting member 42 of the bracket device 34 to the hole 78 of the first post 26a. On the other hand, the blocking member 46 can return to the predetermined position P1 in response to the elastic force released by the elastic member 48, so as to allow the blocking part 62 of the blocking member 46 to face toward the end wall 40 again. As such, the blocking part 62 of the blocking member 46 can lock the first post 26a (please refer to FIG. 7 as well).

Figure 8:
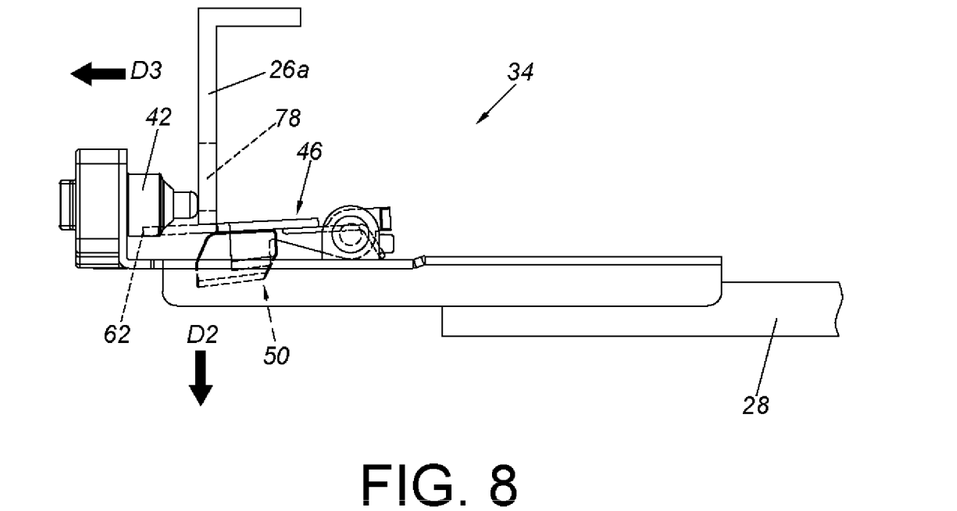
FIG. 8 is a diagram showing the bracket device being moved relative to the post along a direction in order to detach the mounting member from a hole of the post according to an embodiment of the present invention.
Figure 9:
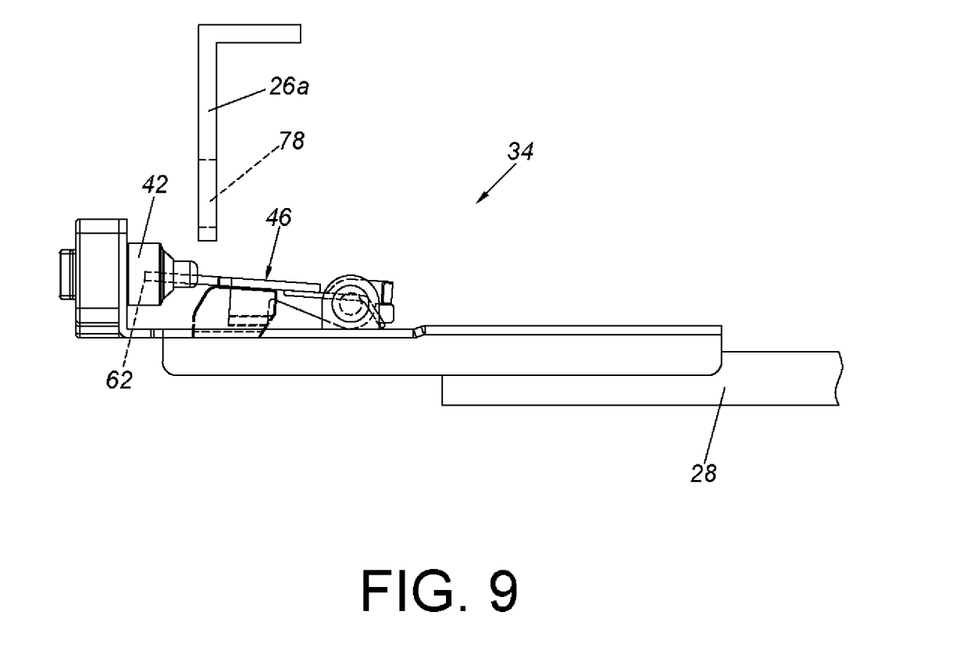
FIG. 9 is a diagram showing the bracket device being detached from the post according to an embodiment of the present invention.

As shown in FIG. 8 and FIG. 9, when the user is going to detach the first rail 28 from the first post 26a, the user can directly operate the blocking member 46 or the operating member 50 in order to deflect and move the blocking member 46 away from the predetermined position P1 along a second direction D2, such that the blocking part 62 of the blocking member 46 no longer locks the first post 26a. Thereafter, the user can move the first rail 28 along a third direction D3 in order to detach the mounting member 42 of the bracket device 34 from the hole 78 of the first post 26a. Accordingly, the first rail 28 can be detached from the first post 26a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
   a longitudinal wall;
   an end wall bent relative to the longitudinal wall;
   at least one mounting member connected to the end wall;
   at least one protruded lug connected to the longitudinal wall, the at least one protruded lug comprising a supporting section having a first side and a second side, the supporting section protruding from and having an end connected to the at least one protruded lug;
   a blocking member pivoted to the at least one protruded lug, the blocking member comprising a blocking part and at least one extension part, the at least one extension part configured to abut against the first side of the supporting section of the at least one protruded lug; and
   an elastic member arranged between the blocking member and the second side of the supporting section of the at least one protruded lug for providing an elastic force to the blocking member, in order to hold the blocking member at a predetermined position to face toward the end wall, wherein a portion of the elastic member abuts against the second side of the supporting section of the at least one protruded lug;
   wherein the first side of the supporting section is opposite to the second side of the supporting section.

2. The bracket device of claim 1, wherein the longitudinal wall has an opening located at a position corresponding to the blocking member.

3. The bracket device of claim 2, further comprising an operating member connected to the blocking member, and configured to be operated to move the blocking member away from the predetermined position.

4. The bracket device of claim 1, wherein the at least one protruded lug is transversely connected to the longitudinal wall.

5. The bracket device of claim 4, wherein the supporting section is substantially longitudinally extended from the at least one protruded lug.

6. The bracket device of claim 1, wherein the elastic member comprises a first part, a second part and a winding part located between the first part and the second part, the first part abuts against the blocking member, and the second part abuts against the second side of the supporting section of the at least one protruded lug.

7. A bracket device, comprising:
   a longitudinal wall;
   an end wall connected to the longitudinal wall;
   at least one mounting member connected to the end wall;
   at least one protruded lug arranged on the longitudinal wall, the at least one protruded lug comprising a supporting section, the supporting section protruding from and having an end connected to the at least one protruded lug;
   a blocking member movably mounted to the at least one protruded lug, the blocking member comprising a blocking part and at least one extension part, the at least one extension part configured to abut against the supporting section of the at least one protruded lug; and
   an elastic member configured to provide an elastic force to the blocking member for holding the blocking part of the blocking member at a predetermined position relative to the end wall;
   wherein the end wall is bent relative to the longitudinal wall, and the blocking member is pivoted to the at least one protruded lug through a shaft, the longitudinal wall has an opening located at a position corresponding to the blocking member.

8. The bracket device of claim 7, wherein the at least one protruded lug is transversely connected to the longitudinal wall, and the supporting section is substantially longitudinally extended from the at least one protruded lug.

9. The bracket device of claim 7, further comprising an operating member connected to the blocking member, and configured to be operated to move the blocking member away from the predetermined position.

10. A bracket device applicable to a slide rail assembly, the slide rail assembly comprising a first rail and a second rail movable relative to the first rail, the bracket device being configured to be connected to the first rail, the bracket device comprising:
    a longitudinal wall;
    an end wall bent relative to the longitudinal wall;
    at least one mounting member connected to the end wall;
    at least one protruded lug arranged on the longitudinal wall, the at least one protruded lug comprising a supporting section having a first side and a second side, the supporting section protruding from and having an end connected to the at least one protruded lug, wherein the at least one protruded lug is fixed relative to the longitudinal wall;
    a blocking member movably mounted to the at least one protruded lug, the blocking member comprising a blocking part and at least one extension part, the at least one extension part configured to abut against the first side of the supporting section of the at least one protruded lug; and
    an elastic member arranged between the blocking member and the second side of the supporting section of the at least one protruded lug for holding the blocking member at a predetermined position to face toward the end wall, wherein a portion of the elastic member abuts against the second side of the supporting section of the at least one protruded lug;

wherein the first side of the supporting section is opposite to the second side of the supporting section.

11. The bracket device of claim 10, wherein the longitudinal wall comprises an opening located at a position corresponding to the blocking member, the bracket device further comprises an operating member connected to the blocking member and configured to be operated to move the blocking member away from the predetermined position.

12. The bracket device of claim 10, wherein the at least one protruded lug is transversely connected to the longitudinal wall, and the supporting section is substantially longitudinally extended from the at least one protruded lug.

* * * * *